(12) United States Patent
Dhyllon

(10) Patent No.: US 10,342,110 B1
(45) Date of Patent: Jul. 2, 2019

(54) PLASMA POWER GENERATOR (Z-BOX AND Z-TOWER)

(71) Applicant: Amen Dhyllon, Wynnewood, PA (US)

(72) Inventor: Amen Dhyllon, Wynnewood, PA (US)

(73) Assignee: SERENDIPITY TECHNOLOGIES LLC., Wynnewood, PA (US)

( * ) Notice: Subject to any disclaimer, the term of this patent is extended or adjusted under 35 U.S.C. 154(b) by 0 days.

(21) Appl. No.: 16/131,375

(22) Filed: Sep. 14, 2018

(51) Int. Cl.
| | |
|---|---|
| *H05H 1/00* | (2006.01) |
| *H05H 1/04* | (2006.01) |
| *H05H 1/12* | (2006.01) |
| *H05H 1/46* | (2006.01) |
| *H01J 37/32* | (2006.01) |

(52) U.S. Cl.
CPC ...... *H05H 1/0087* (2013.01); *H01J 37/32091* (2013.01); *H05H 1/04* (2013.01); *H05H 1/12* (2013.01); *H05H 1/46* (2013.01); *H05H 2001/4645* (2013.01)

(58) Field of Classification Search
CPC .............................................. H01J 37/32091
USPC ....................................... 315/111.21, 111.71
See application file for complete search history.

(56) References Cited

U.S. PATENT DOCUMENTS

| | | | | | |
|---|---|---|---|---|---|
| 3,376,211 | A | * | 4/1968 | Bjornson | C07C 2/80 422/186.03 |
| 5,277,977 | A | * | 1/1994 | Tokuoka | B22F 9/12 148/105 |
| 6,081,643 | A | * | 6/2000 | Lentink | G02B 6/10 385/123 |
| 6,106,561 | A | * | 8/2000 | Farmer | G01V 1/282 345/423 |
| 6,783,627 | B1 | * | 8/2004 | Mahawili | C23C 8/36 118/723 IR |
| 7,828,194 | B2 | * | 11/2010 | Iimura | B23K 37/0461 228/212 |
| 7,938,081 | B2 | * | 5/2011 | Chen | H01J 37/32192 118/723 MW |
| 8,083,961 | B2 | * | 12/2011 | Chen | B05D 3/145 156/345.24 |
| 8,283,512 | B1 | * | 10/2012 | Maganas | F23G 5/002 422/140 |
| 8,555,860 | B2 | * | 10/2013 | McAlister | F02M 57/005 123/490 |
| 8,635,985 | B2 | * | 1/2014 | McAlister | F02M 57/005 123/297 |
| 8,829,386 | B2 | * | 9/2014 | Morrisroe | B23K 10/00 219/121.48 |
| 8,889,534 | B1 | * | 11/2014 | Ventzek | H01L 21/2236 118/723 MW |
| 9,190,289 | B2 | * | 11/2015 | Hudson | H01J 37/32596 |
| 9,333,460 | B2 | * | 5/2016 | Radoiu | B01D 53/32 |
| 9,591,735 | B2 | * | 3/2017 | Kellogg | H01J 27/16 |
| 9,702,552 | B2 | * | 7/2017 | Ali | F23G 5/0276 |
| 9,713,244 | B2 | * | 7/2017 | Tabata | C01B 13/11 |
| 2008/0060760 | A1 | * | 3/2008 | Chen | H01J 37/32192 156/345.41 |

(Continued)

*Primary Examiner* — Dion Ferguson
*Assistant Examiner* — Srinivas Sathiraju
(74) *Attorney, Agent, or Firm* — Adam Warwick Bell; Matthew Rupert Kaser

(57) ABSTRACT

A plasma power generator wherein a plasma is generated by subjecting oxygen (O2) to a strong electromagnetic field. The oxygen plasma enters a chamber and is combined with free electrons from an electron-donation element thereby producing heat.

17 Claims, 5 Drawing Sheets

(56) References Cited

U.S. PATENT DOCUMENTS

| | | | |
|---|---|---|---|
| 2009/0087639 A1* | 4/2009 | Li | H05K 7/20963 428/304.4 |
| 2009/0087640 A1* | 4/2009 | Li | H05K 7/20981 428/304.4 |
| 2011/0127776 A1* | 6/2011 | Schulte | H02N 11/008 290/1 A |
| 2012/0244693 A1* | 9/2012 | Luong | H01L 21/28247 438/591 |
| 2013/0252115 A1* | 9/2013 | Hong | F23L 7/00 429/410 |
| 2013/0344699 A1* | 12/2013 | Chiba | H01L 21/02118 438/700 |
| 2014/0088578 A1* | 3/2014 | Rubinsky | A61B 18/02 606/21 |
| 2014/0163664 A1* | 6/2014 | Goldsmith | A61B 17/00491 623/1.11 |
| 2014/0254620 A1* | 9/2014 | Bessette | H01L 21/0237 372/45.01 |
| 2015/0123540 A1* | 5/2015 | Holbeche | H05H 1/2406 315/111.21 |
| 2016/0045841 A1* | 2/2016 | Kaplan | B01J 19/0093 429/49 |
| 2016/0211041 A1* | 7/2016 | Maganas | G21G 1/02 |
| 2016/0290223 A1* | 10/2016 | Mills | C01B 3/00 |
| 2017/0217811 A1* | 8/2017 | Boughton | C03B 5/025 |
| 2017/0350379 A1* | 12/2017 | Chen | F04B 37/08 |
| 2018/0159459 A1* | 6/2018 | Mills | G21B 3/00 |
| 2018/0347406 A1* | 12/2018 | Friesth | F01K 3/00 |

\* cited by examiner

US 10,342,110 B1

PLASMA POWER GENERATOR (Z-BOX AND Z-TOWER)

FIELD OF THE INVENTION

The present invention relates to a device and system for energy generation by creating an exothermic reaction between a reactive oxygen species and a source of electrons.

BACKGROUND OF THE INVENTION

Plasma is an ionized state of matter. Plasma can be artificially generated by heating or subjecting a neutral gas to a strong electromagnetic field. The ionized gaseous substance becomes electrically conductive. Positive charges in ions are achieved by stripping away electrons orbiting the atomic nuclei, where the total number of electrons removed is related to either increasing temperature or the local density of other ionized matter. When the ionized gas molecules recombine with a electrons, they produce an exothermic reaction.

Plasma gasification is being developed as a source of clean energy from garbage. A plasma waste converter exposes a fuel (waste) to a plasma and the molecules break down by molecular dissociation—the molecular bonds holding them together become excited and break apart, leaving constituent atoms.

The art provides a number of examples of the use of plasma to produce energy, but all these employ an exogenous fuel source. For example, U.S. application Ser. No. 9/713,244, to Toshiba-Mitsubishi-electric industrial systems corporation, discloses a power supply apparatus that uses a resonance means for creating a resonance state between the power supply apparatus and a plasma generator.

Another relevant disclosure is found in U.S. application Ser. No. 9/702,552 that discloses a method and system for producing energy from waste, particularly a method for the conversion of waste into energy in a sealed system where combustion does not take place and the operating pressure prior to the inlet of the steam or power generating equipment is maintained below atmospheric pressure. Destruction of the RDF (refuse derived fuel) is accomplished by subjecting the RDF to a high temperature environment under controlled conditions using plasma torches for generation of plasma gas.

Another prior art example of the use of a plasma to generate electrical energy is found in U.S. patent application Ser. No. 07/828,194 that discloses an electric generator using imploding plasma dynamics (a vortex) for generating electric energy from fuel energy with a fuel-air mixture injection means an and electric energy take-off means connected with the vortex chamber for taking off electric energy generated by the imploding plasma vortex.

An additional prior art example of the use of a plasma to generate electrical energy is found in U.S. application Ser. No. 13/990,835 that discloses a power generation system using a plasma gasifier, includes a plasma gasifier that combusts pulverized coal or biomass using plasma so as to generate a synthesis gas including hydrogen (H2) and carbon monoxide (CO), an impurity removing device that removes an impurity included in the generated synthesis gas, a gas storage tank in which the synthesis gas, an impurity of which has been removed by the impurity removing device, is stored, and a gas engine that combusts the synthesis gas stored in the gas storage tank so as to produce electricity.

A further relevant disclosure is found in U.S. application Ser. No. 8/283,512 that discloses a method and system for enhanced energy production from transforming, reducing and eliminating organic material and medical wastes.

The present invention does not employ an exogenous fuel source such as garbage, but uses an electron-donation element to produce an exothermic reaction.

BRIEF DESCRIPTION OF THE INVENTION

The plasma is generated by subjecting oxygen (O2) to a strong electromagnetic field. The oxygen plasma enters a chamber and is combined with free electrons from an electron-donation element thereby producing heat. Two major embodiments are called Z-box and Z-tower.

DETAILED DESCRIPTION

Figure 1:
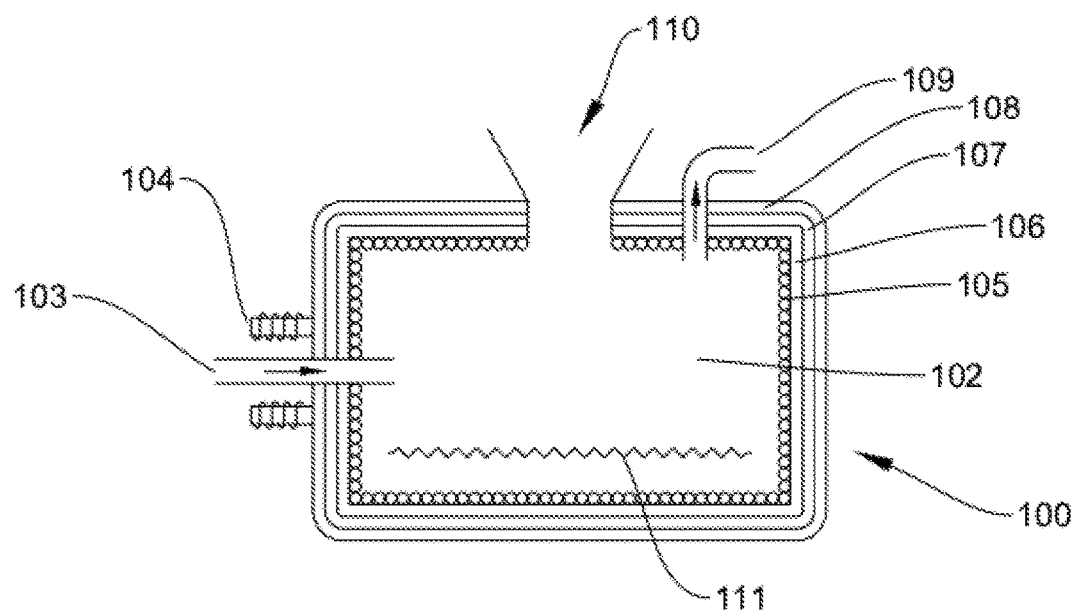
FIG. 1 Plasma box ("Z-box") schematic diagram showing plasma box with plasma chamber (100), void (102), gas inlet (103), magnetic field generator (104), brass coil layer (105), thermo-electric generator layer (106), coolant layer (107), insulation layer (108), gas flu outlet (109), optional fuel inlet port (110), and electron donation element (111).
Figure 2:
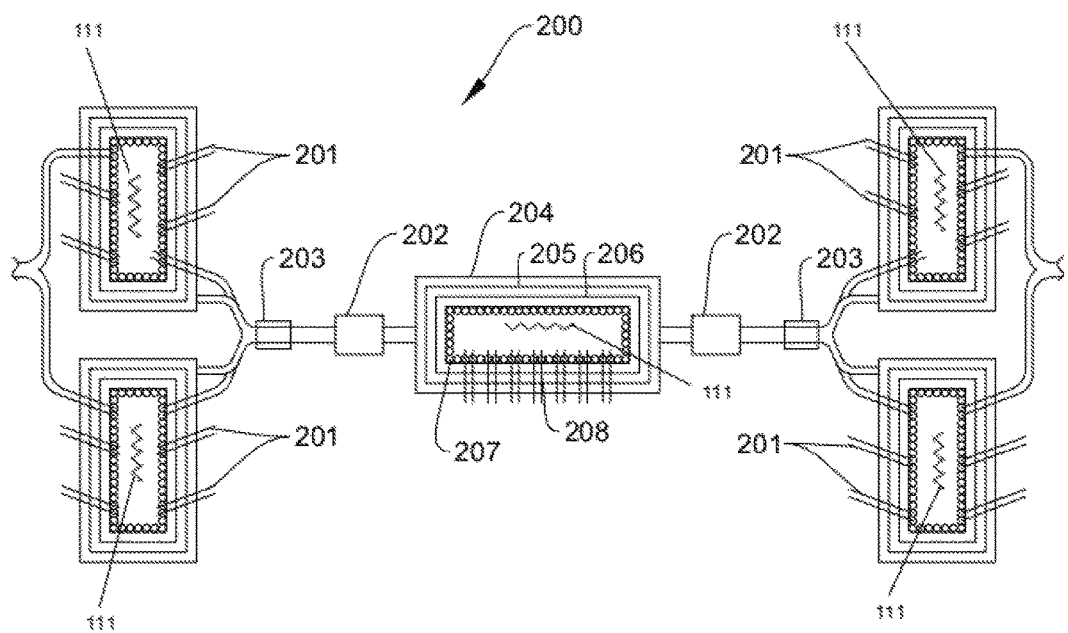
FIG. 2 Plasma box ("Z-box") series expanded system schematic diagram. 201=air/gas inlet; 202=heater; 203=fan; 204=outer casing; 205=coolant layer; 206=thermo-electric generator layer; 207=brass coil layer; 208=air inlet: and 111=electron donation element.

The presently disclosed subject matter now will be described more fully hereinafter with reference to the accompanying drawings in which one embodiment is shown. However, it should be understood that this invention may take many different forms and thus should not be construed as being limited to the embodiment set forth herein. All publications mentioned herein are incorporated by reference for all purposes to the extent allowable by law. In addition, in the figures, identical numbers refer to like elements throughout. Additionally, the terms "a" and "an" as used herein do not denote a limitation of quantity, but rather denote the presence of at least one of the referenced items.

The invention encompasses a device for generating electrical energy. One important aspect of the device is that it employs a plasma furnace to contain and produce an exothermic reaction wherein, by application of a magnetic or electromagnetic filed, an oxygen plasma (an electronegative plasma) or oxygen atoms and/or ions or reactive oxygen species are combined with electrons from an electron source. Oxygen plasma or oxygen atoms or reactive oxygen species and/or ions are combined with electrons that have been 'driven off' from a more electropositive component of the plasma chamber (an "electron-donation element") to produce an exothermic reaction. When the reaction reaches a certain temperature, it becomes self-sustaining and the exothermicity constantly increases the temperature in the plasma chamber unless heat is removed by cooling. Cooling occurs as part of energy generation.

In an alternative embodiment oxygen atoms and/or ions are combined with a fuel which is positively charged due to the effects of heating.

The exothermic reaction may in one embodiment be carried out by reacting Oxygen plasma with a fuel to produce pyrolytic combustion (oxidation). Such fuel may be a solid fuel (any combustible solid including municipal waste). In another embodiment, the fuel may be a gas fuel such as natural gas, hydrogen, methane etc. In a further embodiment, the fuel may be a liquid fuel such as a petroleum or other hydrocarbon liquid fuel or in some embodiments, water.

In another embodiment, the exothermic reaction uses no 'fuel' at all, i.e., no exogenous fuel is added to the plasma chamber, but the electronegative oxygen plasma reacts rapidly with electrons liberated from interior components ("electron-donation elements") of the plasma chamber itself to provide a self-sustaining exothermic reaction.

Any substance capable of providing electrons for reaction with the Oxygen plasma species or oxygen atoms and/or ions may be used as an electron-donation element. In preferred embodiments, the electron-donation element is a metal, for example titanium and/or platinum or related metals. The titanium and/or platinum may be provided as blocks, plates, filaments or any other appropriate shaped form, and will act as a continuous long term source of electrons for as long as they last, which is dependent on their mass and shape, and may be from days, to weeks to months or even years. The electrons from the titanium and/or platinum electron-donation elements will combine with the other reactive species derived from atmospheric Oxygen ($O_2$). Atmospheric Oxygen is passed through a magnetic or electromagnetic field producing oxygen atoms and/or ions. In some embodiments, they will form stable molecules of $O^{-2}$, $O_2$ with a single negative charge or single atoms of atomic oxygen with two negative charges or superoxide ($O^{2-}$) or peroxide ($O_2^{2-}$) ions. Formation of $O^{-2}$ is an exothermic reaction. This entire process forms hot ionized oxygen plasma. Other possibilities are that two ozone molecules can form from three dioxygen molecules. When combined with free electrons, anion-radical O2*- may be formed and heat generated.

In various embodiments, oxygen atoms, not oxygen molecules, enter the chamber. The electro-magnetic field sucks in ambient oxygen, converts it to oxygen atoms and funnels these into the chamber. The titanium and/or platinum filaments give off electrons and that these electrons react with atmospheric Oxygen ($O_2$) to form a stable molecule $O^{-2}$. Formation of $O^{-2}$ is an exothermic reaction. $O^{-2}$ is hot ionized gas.

In one specific embodiment, the interior of the plasma chamber contains an electron-donation element and the interior walls comprise brass coils that are part of the inner wall of the plasma chamber. Brass is used because of its high thermal conductivity, thereby conducting heat efficiently from the inner void to the adjacent layer, for example to a thermo-electric-voltage-generator layer. The inner side (the inner surface facing the void) of these brass coils may be covered with zirconium to efficiently contain the heat inside the chamber, thereby minimizing heat loss. Electron-donation elements are provided by titanium and/or platinum in the form of blocks, plates, filaments or any other appropriate shaped form and provide a continuous long term source of electrons. In some embodiments, these electrons will combine with the incoming oxygen atoms from the ambient air to form stable molecules of $O^{-2}$. Formation of $O^{-2}$ is an exothermic reaction. This entire process forms hot ionized oxygen plasma. An initial plasma state is created and then expands by adding more and more $o^{-2}$ molecules.

When the plasma chamber reaches a certain temperature, no exogenous source of heat is required to drive off electrons from the electron-donation elements, therefore the exothermic reaction becomes self-sustaining until the electron-donation elements are exhausted (which should be days, weeks or months depending on design).

The invention uses a magnetic field or a high frequency voltage to ionize the oxygen molecules, and to concentrate and channel the ionized oxygen from the atmosphere into a combustion chamber, wherein the oxygen ions, which are negatively charged, react either with fuel or electrons provided by electron-donation elements.

In a specific embodiment, the invention provides a device for generating electrical energy comprising a plasma chamber, which is a closed container defined by walls having an outer surface and an inner surface and enclosing an inner chamber with an electron-donation element within the chamber.

The walls having several layers, with, from the inside towards the outside, a heat-conducting layer, a thermo-electric-voltage-generator layer, a coolant-conducting layer, and an insulating later.

In various embodiments, the heat-conducting layer comprises a metal, which may be metal tubing, for example brass tubing, such as coiled brass tubing. The metal tubing may be at least partially coated with a ceramic material. The ceramic material may comprise zirconia ($ZrO2$). The thermo-electric-voltage-generator layer may comprise a thermocouple or thermopile.

EMBODIMENTS AND FURTHER DETAILED DESCRIPTION OF THE INVENTION

In a preferred embodiment, no exogenous fuel is added and the invention encompasses a plasma chamber and at least one electron-donation element. The electron-donation element is fixed within the chamber and provides electrons without replacement for days, weeks or possibly months. Exogenous fuel is not added and oxidative combustion of fuels does not occur.

One or more gas inlets traverse the walls of the plasma chamber and are adapted to introduce gas from outside the plasma chamber into the interior space of the plasma chamber.

One or more magnetic field generators are positioned in proximity to one or more of the gas inlets. Atmospheric oxygen enters the gas inlets. The magnetic field generators strip electrons from the oxygen to form a plasma and/or reactive oxygen species, which is/are directed into the interior space of the plasma chamber.

The chamber contains at least one least one electron-donation element which acts as a source of electrons. The donated electrons combine with the plasma and/or reactive oxygen species to produce stable Oxygen molecules. This process is exothermic and therefore produces net heat energy, which in a typical embodiment is converted into electricity via a thermo-electric-voltage-generator, such as a thermocouple. Electricity may be generated in any known manner by which heat energy is converted to electric energy.

The electron-donation element is a substance capable of providing electrons for reaction with the Oxygen plasma species or reactive oxygen species. Generally, it is heated to a temperature at which electrons are given off. In some embodiments, the electron-donation element is a metal, for example titanium and/or platinum or related metals. In other embodiments, the electron-donation element may include univalent alkali metals such as $Li^+$, $Na^+$, $K^+$, etc., and the divalent alkaline-earth metals $Be^{2+}$, $Mg^{2+}$, and $Ca^{2+}$.

A key aspect of the invention is that the process requires no exogenous fuel other than electron-donation element. In a typical embodiment, the electron-donation element comprises titanium and/or platinum.

The plasma chamber may be defined by walls that have a number of layers comprising, for example, from the inside towards the outside, a heat-conducting layer, a thermo-electric-voltage-generator layer, and a coolant-conducting layer, and an insulating later.

The heat-conducting layer may be composed of materials that conduct heat but also materials that are highly heat resistant and retain heat within the chamber. For example, the heat-conducting layer may comprise a metal in the form brass coils that are at least partially coated by zirconia (Zirconium dioxide) or other ceramic materials. In other embodiments, the layer may be of brass or another metal or material in the form of rods, tubes, sheets, layers, a sprayed coating, beads, wires or other forms.

The term Zirconia refers to Zirconium dioxide ($ZrO_2$) and is a white crystalline oxide of zirconium that forms a ceramic material. It may be doped with, for example, magnesium oxide (MgO), yttrium oxide ($Y_2O_3$, yttria), calcium oxide (CaO), and cerium(III) oxide ($Ce_2O_3$). Zirconia is a highly refractory material, and therefore in the present application may be used as a thermal insulator. It has the ability to allow oxygen ions to move freely through the crystal structure at high temperatures and has high ionic conductivity (and a low electronic conductivity) makes it useful in the present application.

The thermo-electric-voltage-generator is generally a layer in the wall of a plasma chamber adapted to produce electricity from heat or from a heat differential, such as a thermocouple or other means or device that produces a temperature-dependent voltage as a result of the thermo-electric effect.

In other embodiments, the thermo-electric-voltage-generator layer may be replaced with, very broadly, any layer or element (not necessarily present as what a person would normally think of as a layer) that acts to conduct away heat energy to a generator (a means for turning heat energy into electrical power). For example, pipes conducting a liquid may be used as in a conventional boiler to conduct heated liquid or to produce steam that is used to produce electrical energy using a conventional generator.

The coolant-conducting layer in the wall of a plasma chamber is a means adapted to absorb and remove heat. In some embodiments, it may be in the form of a solid conducting element (metal rods, fins etc.) or in the form of "coolant conducting members" or "coolant conducting means" for example tubes or plates (or any other shaped duct) through which a cooling gas or liquid may flow, such as liquid nitrogen, water or oil or another form of coolant or refrigerant liquid or gas. Refrigerants remove heat from a surface by phase transition (from liquid to gas) may be employed.

The insulating later provides a means adapted to thermally insulate the interior from the outside environment. The insulating layer may comprise any heat-resistant material such as ceramic fiber, aerogel, mineral wool or any fibrous material formed by spinning or drawing molten mineral or rock materials such as slag and ceramics. In other embodiments, the insulation may be of a sealed vacuum type. Any suitable insulation may be employed.

The plasma chamber produces heat, some of which may be converted to electricity via the thermo-electric-voltage-generator layer. But under usual circumstances, a heated gas still remains in the chamber that can be vented. This heated gas can be vented to the atmosphere via one or more cleaners/scrubbers and flu gas exhausts. Alternatively, this heated gas may be directed into a flu gas outlet, optionally using a fan (e.g., a cyclone fan), and reheated (using a heater) and/or re-ionized (using a magnetic field generator) and fed into another plasma chamber to produce more heat/electricity. This design choice depends on the efficiency of the system and the temperatures at which the system is run, then energy input required and the energy output achieved.

A novel aspect of the present invention is the lack of any external fuel source, the thermal generation relying rather on the exothermic reaction of electrons from the electron-donation element. Oxygen-mediated combustion is not required. This provides a low-maintenance, efficient cell for the generation of electricity that requires no introduction of fuels, and created a very low-emission, carbon neutral heat source.

Figure 3:
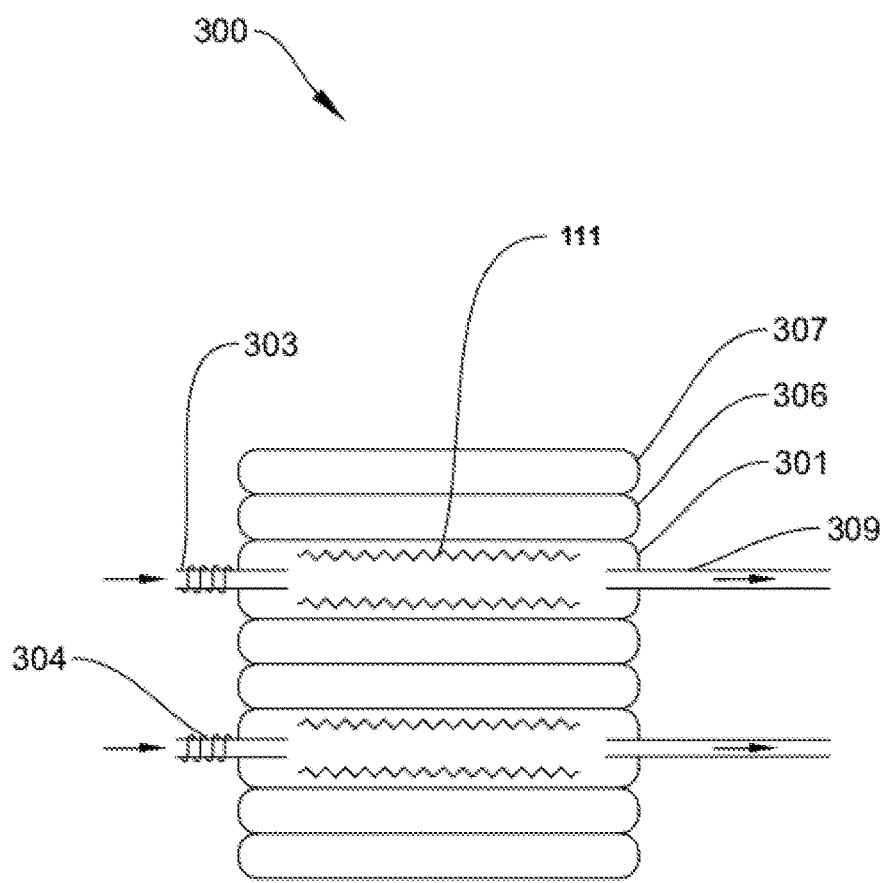
FIG. 3 Plasma tower ("Z-tower") (300) schematic diagram. 301=plasma box heating layer; 303=air inlet; 304=heating element; 306=thermo-electric generator layer; 307=coolant layer; 309=flue gas outlet: and 111=electron donation element.
Figure 4:
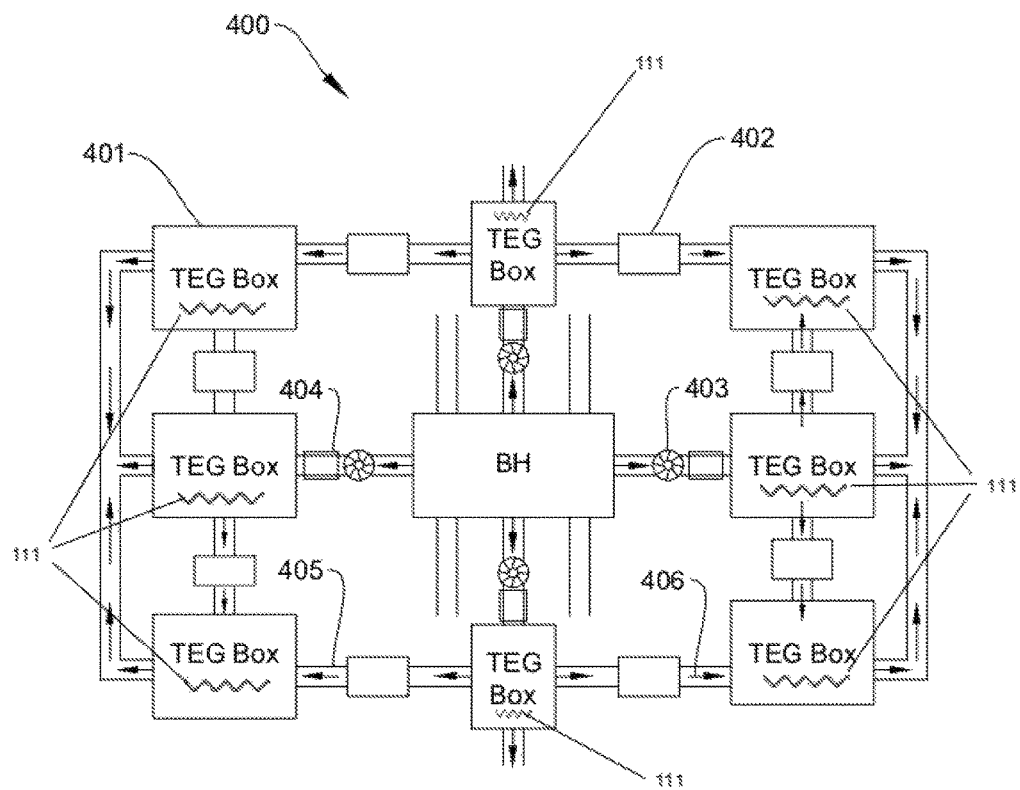
FIG. 4 A thermoelectric power plant design referred to as "Black Hole" (BH) and comprised of a network of plasma boxes connected together via heaters and fans. "TEG"=thermal electric generator. In this design, a number of TEG boxes or Z-boxes (optionally with multiple layers—like Z-tower) are connected in series to extract power from flue gasses. This design provides efficiency of scale. 401=TEG box; 404=heater; 403=fan; 406=flow of gasses; 405=flow of gasses: and 111=electron donation element.
Figure 5:
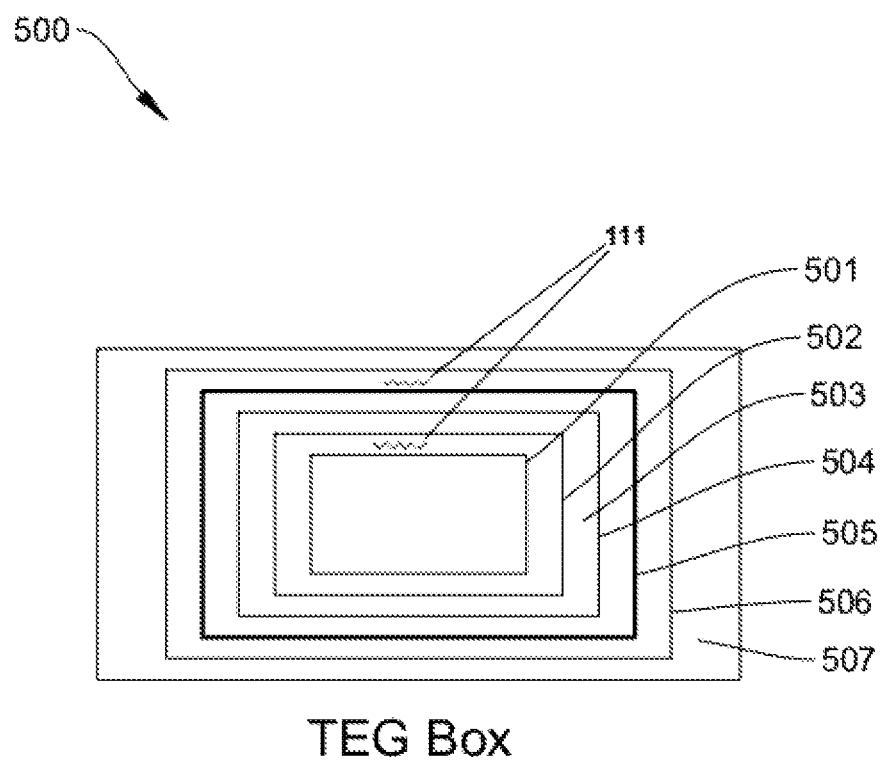
FIG. 5 is a schematic of a "TEG box" which is a thermoelectric generating system comprising with heated gas (flu gas) on in the inside void, and more than one concentric thermo-electric generating later surrounding the void, with a heating element positioned between two TEG layers. The system can be expanded to any size by adding concentric elements so long as a TE element is sandwiched between a heating element (or a heat source such as hot gas) and a cooling element. 501=brass layer; 502=TEG layer; 503=coolant layer; 504=TEG layer; 505=heating element; 506=TEG layer; 507=coolant layer surrounded by casing; and 111=electron donation element.

Two major embodiments of the invention are called "Z-box" and "Z-tower". The Z-box is described above and disclosed schematically in FIG. 1. The Z-box embodiment can be modified to include a means to re-heat the flu gasses, and channel them through one or more successive plasma boxes. This provides a scalable and efficient system to extract energy from plasma-generated and heated gasses. The "Z-tower" is disclosed schematically in FIG. 3 and is comprises a number of Z-boxes stacked together in series, to form a compact and efficient generator system scalable to suit various applications.

EXAMPLES OF EMBODIMENTS OF THE INVENTION

Example 1

The "Z-box" in its simplest form is a containment chamber for a plasma, with a gas input and a plasma generator, and a source of electrons from an electron-donation element. Heat generated is converted t electrical energy using a thermos-electric converter or similar means.

In its broadest form the Z-box encompasses the following:
(1) A device for generating heat energy comprising:
  a plasma chamber comprising a substantially closed container having an outer surface and an inner surface, defined by walls, and enclosing an interior space,
  the interior space enclosing at least one electron-donation element,
  further comprising one or more gas inlets traversing the walls and adapted to introduce gas from outside the plasma chamber into the interior space of the plasma chamber
  further comprising one or more magnetic field generators positioned in proximity to one or more of the gas inlets
  further comprising a flu gas outlet.
(2) The device of claim 1 wherein the electron-donation element comprises titanium and/or platinum.
(3) The device of claim 1 wherein the walls having several layers, comprising, from the inside towards the outside, a heat-conducting layer, a thermo-electric-voltage-generator layer, and a coolant-conducting layer, and an insulating later.
(4) The device of claim 3 wherein the heat conducting layer consists of metal coils.
(5) The device of claim 4 wherein the brass coils are brass and are at least partially coated with zirconia.
(6) The device of claim 3 wherein the thermo-electric-voltage-generator layer comprises a thermocouple.
(7) The device of claim 3 wherein the coolant-conducting layer comprises conducting members adapted to conduct a coolant fluid.
(8) The device of claim 7 wherein the coolant comprises liquid nitrogen
(9) The device of claim 1 capable of generating heat energy specifically without the introduction and combustion of an exogenous fuel other than electron-donation element (such as titanium and/or platinum).
(10) A method for generating electric energy comprising,
  (a) providing a device for generating heat energy comprising:
    a plasma chamber comprising a substantially closed container having an outer surface and an inner surface, defined by walls, and enclosing an inner space,
    the walls having several layers, comprising, from the inside towards the outside, a heat-conducting layer, a thermo-electric-voltage-generator layer, and a coolant-conducting layer, and an insulating later,
    the inner space enclosing at least one titanium and/or platinum electron-donation element,
    further comprising one or more gas inlets traversing the walls and adapted to introduce gas from outside the plasma chamber into the inner void of the plasma chamber
    further comprising one or more magnetic field generators positioned in proximity to one or more of the gas inlets
    further comprising a flu gas outlet;
  (b) heating the electron-donation element such that free electrons are driven off into the plasma chamber, and
  (c) directing a atmospheric air into the plasma chamber through the gas inlets, wherein the gas passes through the magnetic field created by the magnetic field generators so that the oxygen in the gas is converted to a plasma or to reactive oxygen species which are electronegative;
  (d) in the plasma chamber, reacting the plasma or to reactive oxygen species with the free electrons, thereby creating heat; and
  (e) converting the heat into electrical energy.

Example 2

In a slightly more specific embodiment, the Z-box encompasses the following:

(11) A device for generating electrical energy comprising: a plasma chamber comprising a substantially closed container having an outer surface and an inner surface defined by walls and enclosing an interior space,
  The interior space containing at least one electron-donation element,
  the walls having several layers, comprising, from the inside towards the outside, a heat-conducting layer, a thermo-electric-voltage-generator layer a coolant-conducting layer, and an insulating layer.
(12) The device of claim 11 wherein the electron-donation element comprises titanium and/or platinum.
(13) The device of claim 11 wherein the heat-conducting layer comprises metal elements.
(14) The device of claim 11 wherein the heat-conducting layer comprises brass tubing.
(15) The device of claim 11 wherein the heat-conducting layer comprises coils of brass tubing.
(16) The device of claim 13 wherein the metal tubing is at least partially coated with a ceramic material.
(17) The device of claim 16 wherein the ceramic material comprises zirconia (ZrO2).
(18) The device of claim 11 wherein the a thermo-electric-voltage-generator layer comprises a thermocouple.
(19) The device of claim 11 wherein the coolant-conducting layer comprises tubes conducting a coolant fluid.
(20) The device of claim 11 wherein the coolant fluid is a liquid.
(21) The device of claim 11 wherein the liquid is liquid nitrogen.
(22) The device of claim 11 further comprising a fuel inlet port for introducing fuel. (this is optional and not necessary for the basic novel embodiment).
(23) The device of claim 11 further comprising one or more gas inlets adapted to introduce gas into the plasma chamber.
(24) The device of claim 11 further comprising one or more magnetic field generators positioned in proximity to one or more of the gas inlets.
(25) The device of claim 24 wherein the magnetic field generators are electromagnets.
(26) The device of claim 24 wherein the magnetic field generators permanent magnets.
(27) The device of claim 11 further comprising one or more flu gas outlets attached to the plasma chamber adapted to facilitate the exit of gasses from the plasma chamber.
(28) The device of claim 27 wherein one of more flu gas outlets are attached to a fan (cyclone fan) and a heater such that the fan drives the flu gas through the flu gas outlet, through the heater, so that the flu gas is re-heated.
(29) The device of claim 28 further comprising a feeder duct functionally connected downstream of the flu gas outlet, via the fan and the heater, whereby the re-heated gas is directed through the feeder duct to a second plasma chamber where further energy generation occurs.

Example 3

In a specific, preferred embodiment, the Z-box encompasses the following:
(30) A device for generating electrical energy comprising: a plasma chamber comprising a substantially closed container defined by walls having an outer surface and an inner surface and enclosing an interior space,
  the interior space enclosing an electron-donation element,
  wherein the device comprises one or more gas inlets adapted to introduce gas into the plasma chamber; one or more magnetic field generators positioned in proximity to one or more of the gas inlets; one or more flu gas outlets attached to the plasma chamber adapted to facilitate the exit of gasses from the plasma chamber; wherein said walls have several layers, comprising, from the inside towards the outside, a brass coil layer wherein the brass coils are at least partially coated by zirconia or other ceramic materials, a thermo-electric-voltage-generator layer, a coolant-conducting layer, and an insulating layer.

Example 4

The "Z-tower" comprises a number of Z-boxes stacked together in series, similar in design to an electric pile battery or thermopile, to form a compact and efficient generator system scalable to suit various applications. The Z-tower may be claimed as follows:
(31) A system for the generation of electric energy comprising a repeating series of layers in physical contact with one another, the layers comprising, in order, plasma chamber layer, a thermos-electric layer, and a coolant layer,
  wherein the plasma chamber layer comprises a plasma chamber comprising a substantially closed container having an outer surface and an inner surface, defined by walls, and enclosing an interior space,
  the interior space enclosing at least one electron-donation element,
  further comprising one or more gas inlets traversing the walls and adapted to introduce gas from outside the plasma chamber into the interior space of the plasma chamber,
  further comprising one or more magnetic field generators positioned in proximity to one or more of the gas inlets
  further comprising a flu gas outlet.
(32) The system of claim 31 wherein the electron-donation element comprises titanium and/or platinum.
(33) The system of claim 31 wherein the heat-conducting layer comprises metal elements.
(34) The system of claim 31 wherein the heat-conducting layer comprises brass tubing.
(35) The system of claim 31 wherein the heat-conducting layer comprises coils of brass tubing.
(36) The system of claim 33 wherein the metal tubing is at least partially coated with a ceramic material.
(37) The system of claim 36 wherein the ceramic material comprises zirconia (ZrO2).
(38) The system of claim 31 wherein the a thermo-electric-voltage-generator layer comprises a thermocouple.
(39) The system of claim 31 wherein the coolant-conducting layer comprises tubes conducting a coolant fluid.
(40) The system of claim 39 wherein the coolant fluid is a liquid.
(41) The system of claim 40 wherein the liquid is liquid nitrogen.

Example 5

Methods of the Invention
  Another aspect of the invention encompasses methods for generating heat energy by using a self-sustaining exothermic reaction, specifically, without the introduction and combustion of an exogenous fuel other than electron-donation element (such as titanium and/or platinum). For example:
(1) A method for generating heat energy by using a self-sustaining exothermic reaction, the method comprising:
  (a) providing a device for generating heat energy comprising:
    a plasma chamber comprising a substantially closed container having an outer surface and an inner surface, defined by walls, and enclosing an interior space,
    the interior space enclosing at least one electron-donation element,
    further comprising one or more gas inlets traversing the walls and adapted to introduce gas from outside the plasma chamber into the interior space of the plasma chamber,
    further comprising one or more magnetic field generators positioned in proximity to one or more of the gas inlets
    further comprising a flu gas outlet;
  (b) heating the electron-donation element such that free electrons are driven off into the plasma chamber, and
  (c) directing gas (e.g., atmospheric air) into the plasma chamber through the gas inlets, wherein the gas passes through the magnetic field created by the magnetic field generators so that the oxygen in the gas is converted to a plasma or to reactive oxygen species which are electronegative;
  (d) in the plasma chamber, reacting the plasma or to reactive oxygen species with the free electrons, thereby creating heat;
  (e) converting the heat into electrical energy.
(2) The method of claim 1 wherein the electron-donation element comprises titanium and/or platinum.
(3) The method of claim 1 wherein the heat-conducting layer comprises metal elements.
(4) The method of claim 1 wherein the heat-conducting layer comprises brass tubing.
(5) The method of claim 1 wherein the heat-conducting layer comprises coils of brass tubing.
(6) The method of claim 3 wherein the metal tubing is at least partially coated with a ceramic material.
(7) The method of claim 6 wherein the ceramic material comprises zirconia (ZrO2).
(8) The method of claim 1 wherein the a thermo-electric-voltage-generator layer comprises a thermocouple.
(9) The method of claim 1 wherein the coolant-conducting layer comprises tubes conducting a coolant fluid.
(10) The method of claim 1 wherein the coolant fluid is a liquid.
(11) The method of claim 1 wherein the liquid is liquid nitrogen.

Definitions and Further Information Relevant to Embodiments

Plasma chamber=a chamber adapted to contain a plasma or other reactive oxygen species, and in which heat is generated by the reaction of a plasma or other reactive oxygen species with electrons.
Fuel=any combustible material
Electron-donation element=any substance capable of providing electrons for reaction with the Oxygen plasma species may be used as an electron-donation element. In preferred embodiments, the electron-donation element is a metal, for example titanium and/or platinum or related metals.
Plasma=a plasma is one of the four fundamental states of matter. It does not exist freely on the Earth's surface under normal conditions. Plasma can be artificially generated by heating or subjecting a neutral gas to a strong electromagnetic field creating an ionized gaseous state that is electrically conductive. Plasmas can also be created by using high frequency voltages (typically kHz to >MHz) to ionize gas (usually at low pressure). Either system may be used in the present invention. At this point, electromagnetic fields dominate the behavior of the matter. Based on the surrounding environmental temperature and density, partially ionized or fully ionized forms of plasma may be produced. Neon signs and lightning are examples of partially ionized plasma, while the interior of the stars contains fully ionized plasma. Plasma is an electrically neutral medium of unbound positive and negative particles (i.e. the overall charge of a plasma is roughly zero). Although these particles are unbound, they are not 'free' in the sense of not experiencing forces. In U.S. Pat. No. 0,514,170 ("Incandescent Electric Light", 1894 Feb. 6), Nikola Tesla describes a plasma lamp. In plasma, gas atoms are excited to higher energy states and are ionized. As the electrons fall back to their valence states and into their normal energetic states in the electron shells, they release a photon of light, this results in the characteristic "glow" or light associated with plasma. Oxygen plasma emits a light blue color. A plasma's activated species include atoms, molecules, ions, electrons, free radicals, metastables, and photons in the short wave ultraviolet (vacuum UV, or VUV for short) range. This mixture can exist at around room temperature, and provides a highly reactive gas that interacts with almost any surface in contact with the plasma. If the gas used is oxygen, the plasma highly reactive and the VUV energy is very effective in the breaking of most organic bonds (i.e., C—H, C—C, C=C, C—O, and C—N) as well as any high molecular weight contaminants. The oxygen species created in the plasma ($O^{2+}$, $O^{2-}$, $O_3$, O, $O^+$, $O^-$, ionized ozone, metastable excited oxygen, and free electrons) react with most substrates including organic contaminants to form $H_2O$, CO, $CO_2$, and lower molecular weight hydrocarbons. These compounds have relatively high vapor pressures and are evacuated easily.

a heat-conducting (layer)=a layer in the wall of a plasma chamber adapted to absorb, and/or conduct and/or retain heat, and in some cases to provide a source of electrons that may combine with negatively charged plasma particles in the plasma chamber in an exothermic reaction.

a thermo-electric-voltage-generator (layer)=a layer in the wall of a plasma chamber adapted to produce electricity from heat or from a heat differential, such as a thermocouple, which is an electrical device consisting of two dissimilar electrical conductors that produces a temperature-dependent voltage as a result of the thermoelectric effect.

a coolant-conducting layer=a layer in the wall of a plasma chamber adapted to absorb and remove heat according to Newton's first law of thermodynamics, for example in the form of a solid conducting element or in the form of "coolant conducting members" for example tubes or plates (or any other shaped duct) through which a cooling gas or liquid may flow, such as liquid nitrogen, carbon dioxide, water, oil etc.

an insulating later=a layer in the wall of a plasma chamber adapted to insulate the interior from the outside environment. Insulation may be of any suitable substance, many of which are known.

Heater=a device adapted to heat a gas such as a plasma-box heater, electric or gas heater.

Fan=a device adapted to propel and drive a gas through an area.

Walls=the device includes walls, that in some embodiments have several layers, comprising, from the inside towards the outside, for example, and not exclusively, a brass coil layer wherein the brass coils are coated by zirconia or other ceramic materials, a thermo-electric-voltage-generator layer, a coolant-conducting layer, and an insulating later. It should be noted that the components of the layers need not be present over the entire surface of the walls, but may be present only on certain walls or at certain portions of the walls.

Zirconia: Zirconium dioxide is a ceramic material used in various applications such as dentistry and jet engine manufacture. $ZrO2$ adopts a monoclinic crystal structure at room temperature and transitions to tetragonal and cubic at higher temperatures. The change of volume caused by the structure transitions from tetragonal to monoclinic to cubic induces large stresses, causing it to crack upon cooling from high temperatures. When the zirconia is blended with some other oxides, the tetragonal and/or cubic phases are stabilized. Effective dopants include magnesium oxide (MgO), yttrium oxide ($Y2O3$, yttria), calcium oxide (CaO), and cerium(III) oxide ($Ce2O3$). The very low thermal conductivity of cubic phase of zirconia also has led to its use as a thermal barrier coating, or TBC, in jet and diesel engines to allow operation at higher temperatures. Thermodynamically, the higher the operation temperature of an engine, the greater the possible efficiency. Another low thermal conductivity use is a ceramic fiber insulation for crystal growth furnaces, fuel cell stack insulation and infrared heating systems.

Thermocouples used in the invention may be of any suitable type, for example the following. Nickel-alloy thermocouples (types E, J, K, M, N, T); Platinum/rhodium-alloy thermocouples (types B, R, S); Tungsten/rhenium-alloy thermocouples (types C, D, G); Chromel-gold/iron-alloy thermocouples; Platinum/molybdenum-alloy thermocouples; Iridium/rhodium alloy thermocouples; Pure noble-metal thermocouples Au—Pt, Pt—Pd; and Skutterudite thermocouples.

Power production by use of a thermocouple. A thermocouple can produce current to drive some processes directly, without the need for extra circuitry and power sources. For example, the power from a thermocouple can activate a valve when a temperature difference arises. The electrical energy generated by a thermocouple is converted from the heat which must be supplied to the hot side to maintain the electric potential. A continuous transfer of heat is necessary because the current flowing through the thermocouple tends to cause the hot side to cool down and the cold side to heat up (the Peltier effect).

Thermopiles. Thermocouples can be connected in series to form a thermopile, where all the hot junctions are exposed to a higher temperature and all the cold junctions to a lower temperature. The output is the sum of the voltages across the individual junctions, giving larger voltage and power output.

Thermocouples have found use in various electricity generating applications such as in radioisotope thermoelectric generators in which the radioactive decay of transuranic elements provides a heat source to power spacecraft on missions too far from the Sun to use solar power. Thermopiles heated by kerosene lamps have been used to run battery-less radio receivers. Lanterns that use the heat from a candle can be used to run light-emitting diodes.

The claims, disclosure and drawings of the present invention define but are not intended to limit the invention.

All patents and publications disclosed herein are incorporated by reference to the fullest extent permissible by law.

The invention claimed is:
1. A device for generating heat energy comprising:
a plasma chamber composed of a substantially closed container having an outer surface and an inner surface, defined by walls, and enclosing an interior space,
the interior space enclosing at least one electron-donation element, further comprising one or more gas inlets traversing the walls and adapted to introduce gas from outside the plasma chamber into the interior space of the plasma chamber, further comprising one or more magnetic field generators positioned in proximity to one or more of the gas inlets, further comprising a flue gas outlet, wherein the walls have layers, comprising, from the inside towards the outside, a heat-conducting layer, a thermo-electric-voltage-generator layer, a coolant-conducting layer, and an insulating later.

2. The device of claim 1 wherein the heat conducting layer consists of metal coils.

3. The device of claim 2 wherein the metal coils are brass and are at least partially coated with zirconia.

4. The device of claim 1 wherein the thermo-electric-voltage-generator layer comprises a thermocouple.

5. The device of claim 1 wherein the coolant-conducting layer comprises conducting members adapted to conduct a coolant fluid.

6. The device of claim 5 wherein the coolant fluid comprises liquid nitrogen.

7. The device of claim 1 further comprising one or more flue gas outlets attached to the plasma chamber adapted to facilitate the exit of gasses from the plasma chamber.

8. The device of claim 7 wherein one of more flue gas outlets are attached to a fan (cyclone fan) and a heater such that the fan drives the flue gas through the flu gas outlet, through the heater, so that the flue gas is re-heated.

9. The device of claim 8 further comprising a feeder duct functionally connected downstream of the flue gas outlet, via the fan and the heater, whereby the re-heated gas is directed through the feeder duct to a second plasma chamber where further energy generation occurs.

10. A device for generating electrical energy comprising: a plasma chamber comprising a substantially closed container defined by walls having an outer surface and an inner surface and enclosing an interior space,
 the interior space enclosing an electron-donation element, but specifically comprising no exogenous fuel,
 and the plasma chamber specifically having no fuel inlet port,
 wherein the device comprises one or more gas inlets adapted to introduce gas into the plasma chamber; one or more magnetic field generators positioned in proximity to one or more of the gas inlets; one or more flue gas outlets attached to the plasma chamber adapted to facilitate the exit of gasses from the plasma chamber;
 wherein said walls have several layers, comprising, from the inside towards the outside, a brass coil layer wherein the brass coil layer is at least partially coated by zirconia or other ceramic materials, a thermo-electric-voltage-generator layer, a coolant-conducting layer, and an insulating layer.

11. A method for generating electric energy without the addition or use of an exogenous fuel, the method comprising,
 (a) providing a device for generating heat energy comprising:
  a plasma chamber comprising a substantially closed container having an outer surface and an inner surface, defined by walls, and enclosing an inner space,
  the walls having several layers, comprising, from the inside towards the outside, a heat-conducting layer, a thermo-electric-voltage-generator layer, and a coolant-conducting layer, and an insulating later,
  the inner space enclosing at least one titanium and/or platinum electron-donation element,
  further comprising one or more gas inlets traversing the walls and adapted to introduce gas from outside the plasma chamber into the inner space of the plasma chamber,
  further comprising one or more magnetic field generators positioned in proximity to one or more of the gas inlets,
  further comprising a flue gas outlet;
 (b) heating the electron-donation element such that free electrons are driven off into the plasma chamber,
 (c) directing atmospheric air into the plasma chamber through the gas inlets, wherein the gas passes through the magnetic field created by the magnetic field generators so that the oxygen in the gas is converted to a plasma or to reactive oxygen species which are electronegative,
 (d) in the plasma chamber, reacting the plasma or to reactive oxygen species with the free electrons, thereby creating heat; and
 (e) converting the heat into electrical energy.

12. A system for the generation of electric energy comprising a repeating series of layers in physical contact with one another, the layers comprising, in order, plasma chamber layer, a thermo-electric layer, and a coolant layer,
 wherein the plasma chamber layer comprises a plasma chamber comprising a substantially closed container having an outer surface and an inner surface, defined by walls, and enclosing an interior space,
 the interior space enclosing at least one electron-donation element,
 further comprising one or more gas inlets traversing the walls and adapted to introduce gas from outside the plasma chamber into the interior space of the plasma chamber,
 further comprising one or more magnetic field generators positioned in proximity to one or more of the gas inlets
 further comprising a flue gas outlet.

13. The system of claim 12 wherein the electron-donation element comprises titanium and/or platinum.

14. The system of claim 12 wherein the plasma chamber layer comprises brass tubing at least partially coated with a ceramic material.

15. The system of claim 12 wherein the a thermo-electric layer comprises a thermocouple.

16. The system of claim 12 wherein the coolant-conducting layer comprises tubes conducting a coolant fluid.

17. The system of claim 12 wherein the coolant fluid is liquid nitrogen.

* * * * *